United States Patent
Ueno et al.

(10) Patent No.: US 10,176,981 B2
(45) Date of Patent: Jan. 8, 2019

(54) SEMICONDUCTOR DEVICE AND SEMICONDUCTOR DEVICE MANUFACTURING METHOD

(71) Applicant: FUJI ELECTRIC CO., LTD., Kanagawa (JP)

(72) Inventors: Katsunori Ueno, Matsumoto (JP); Kiyokazu Nakagawa, Kofu (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/908,823

(22) Filed: Mar. 1, 2018

(65) Prior Publication Data

US 2018/0190487 A1   Jul. 5, 2018

Related U.S. Application Data

(63) Continuation of application No. PCT/JP2017/007510, filed on Feb. 27, 2017.

(30) Foreign Application Priority Data

Feb. 29, 2016   (JP) .................................. 2016-037588

(51) Int. Cl.
*H01L 29/20*   (2006.01)
*H01L 21/02*   (2006.01)
(Continued)

(52) U.S. Cl.
CPC ...... *H01L 21/02164* (2013.01); *C23C 16/402* (2013.01); *H01L 21/02208* (2013.01); (Continued)

(58) Field of Classification Search
None
See application file for complete search history.

(56) References Cited

U.S. PATENT DOCUMENTS

| 2004/0217354 A1 | 11/2004 | Kamo et al. |
| 2014/0264564 A1* | 9/2014 | Cheng ................ H01L 29/7827 257/330 |
| 2016/0013282 A1 | 1/2016 | Murakami et al. |
| 2018/0190487 A1* | 7/2018 | Ueno .................... H01L 29/78 |

FOREIGN PATENT DOCUMENTS

| JP | H05129202 A | 5/1993 |
| JP | H09153462 A | 6/1997 |

(Continued)

OTHER PUBLICATIONS

International Search Report for International Patent Application No. PCT/JP2017/007510, issued by the Japan Patent Office dated May 23, 2017.

(Continued)

*Primary Examiner* — Jack Chen

(57) ABSTRACT

If a $SiO_2$ film is formed on a semiconductor substrate using TEOS (tetraethylorthosilicate: $Si(OC_2H_5)_4$), carbon (C) may be mixed in the $SiO_2$ film in some cases. In a $SiO_2$ film, carbon may function as fixed charges. For example, if carbon (C) is mixed in a $SiO_2$ film as a gate insulating film of a MOSFET (Metal-Oxide-Semiconductor Field-Effect Transistor), the gate threshold voltage ($V_{th}$) may fluctuate. A semiconductor device using a gallium nitride semiconductor layer is provided. The semiconductor device includes: a silicon dioxide film that is provided at least partially in direct contact with the gallium nitride semiconductor layer and has impurity atoms, wherein the silicon dioxide film contains as the impurity atoms: carbon at concentration higher than 0 $cm^{-3}$ and lower than $2E+18$ $cm^{-3}$; and gallium at concentration equal to or lower than $1E+17$ $cm^{-3}$.

3 Claims, 11 Drawing Sheets

(51) Int. Cl.
*H01L 29/51* (2006.01)
*H01L 29/49* (2006.01)
*H01L 21/28* (2006.01)
*H01L 29/78* (2006.01)
*H01L 29/66* (2006.01)
*C23C 16/40* (2006.01)
*H01L 29/12* (2006.01)
*H01L 29/45* (2006.01)
*H01L 21/265* (2006.01)
*H01L 29/36* (2006.01)
*H01L 29/267* (2006.01)

(52) U.S. Cl.
CPC .. *H01L 21/02274* (2013.01); *H01L 21/28264* (2013.01); *H01L 29/12* (2013.01); *H01L 29/2003* (2013.01); *H01L 29/495* (2013.01); *H01L 29/51* (2013.01); *H01L 29/66522* (2013.01); *H01L 29/66712* (2013.01); *H01L 29/78* (2013.01); *H01L 29/7802* (2013.01); *H01L 21/26546* (2013.01); *H01L 29/267* (2013.01); *H01L 29/36* (2013.01); *H01L 29/452* (2013.01)

(56) References Cited

FOREIGN PATENT DOCUMENTS

| JP | H1022382 A | 1/1998 |
| JP | 2000357690 A | 12/2000 |
| JP | 2004253520 A | 9/2004 |
| JP | 2008186839 A | 8/2008 |
| JP | 2015162578 A | 9/2015 |
| JP | 2016018888 A | 2/2016 |

OTHER PUBLICATIONS

M.Placidi, et al., Deposited Thin SiO2 for Gate Oxide on n-Type and p-Type GaN, Journal of the Electrochemical Society, Sep. 16, 2010, vol. 157, Issue 11, H1008-H1013.

Office Action issued for counterpart Japanese Application 2016-037588, drafted by the Japan Patent Office dated Dec. 2, 2016.

Katsunori Ueno, et al., MOS characteristics of SiO2 deposited by plasma CVD on n-GaN substrate, The preprint of lecture for the 62th Spring Science Lecture Meeting of the Japan Society of Applied Physics, 2015, 13p-P17-17, p. "12-386", [Experimental Method].

Office Action issued for counterpart Japanese Application 2016-037588, drafted by the Japan Patent Office dated Feb. 16, 2017.

* cited by examiner

SEMICONDUCTOR DEVICE AND SEMICONDUCTOR DEVICE MANUFACTURING METHOD

The contents of the following Japanese patent applications are incorporated herein by reference:
NO. 2016-037588 filed in JP on Feb. 29, 2016, and
NO. PCT/JP2017/007510 filed on Feb. 27, 2017.

BACKGROUND

1. Technical Field

The present invention relates to a semiconductor device and a semiconductor device manufacturing method.

Conventionally, a silicon dioxide gate insulating film is formed by thermal oxidation (please see Patent Document 1, for example).

PRIOR ART DOCUMENT

Patent Document

[Patent Document 1] Japanese Patent Application Publication No. 2015-162578

If a silicon dioxide ($SiO_2$) film is formed on a semiconductor substrate using TEOS (tetraethylorthosilicate: $Si(OC_2H_5)_4$), carbon (C) may be mixed in the silicon dioxide film in some cases. In a silicon dioxide film, carbon may function as fixed charges. For example, if a silicon dioxide film is used as a gate insulating film of a MOSFET (Metal-Oxide-Semiconductor Field-Effect Transistor), the gate threshold voltage ($V_{th}$) may fluctuate due to carbon in the silicon dioxide film.

[General Disclosure]

A first aspect of the present invention provides a semiconductor device using a gallium nitride semiconductor layer. The gallium nitride semiconductor layer may include a silicon dioxide film. The silicon dioxide film may be provided at least partially in direct contact with the gallium nitride semiconductor layer. The silicon dioxide film may have impurity atoms. The silicon dioxide film may contain, as the impurity atoms, carbon at concentration higher than 0 $cm^{-3}$ and lower than 2E+18 $cm^{-3}$. The silicon dioxide film may contain, as the impurity atoms, gallium at concentration equal to or lower than 1E+17 $cm^{-3}$.

The concentration of the impurity atoms may be concentration at any position which is 10 nm or more and less than half of the thickness of the silicon dioxide film above a front surface of the gallium nitride semiconductor layer.

The semiconductor device may further include a gate electrode. The gate electrode may be provided on and in direct contact with the silicon dioxide film. On a front surface side on which the silicon dioxide film is provided, the gallium nitride semiconductor layer may have a p-type well region. The p-type well region may have p-type impurities to the gallium nitride semiconductor layer. The silicon dioxide film may be a gate insulating film. The gate insulating film may be provided between the gate electrode and the p-type well region.

The silicon dioxide film may be an interlayer dielectric film. The interlayer dielectric film may be provided on the gallium nitride semiconductor layer.

A second aspect of the present invention provides a method of manufacturing a semiconductor device having a gallium nitride semiconductor layer. The method of manufacturing the semiconductor device may include forming a silicon dioxide film. The silicon dioxide film may have impurity atoms. The silicon dioxide film may be formed at least partially in direct contact with the gallium nitride semiconductor layer. The silicon dioxide film may contain, as the impurity atoms, carbon at concentration lower than 2E+18 $cm^{-3}$. The silicon dioxide film may contain, as the impurity atoms, carbon at concentration equal to or higher than 5E+17 $cm^{-3}$. The silicon dioxide film may contain, as the impurity atoms, gallium at concentration equal to or lower than 1E+17 $cm^{-3}$.

The forming the silicon dioxide film may have supplying a TEOS gas as a silicon raw material.

The forming the silicon dioxide film may have supplying an oxygen gas as an oxygen raw material and forming the silicon dioxide film by plasma CVD.

In the forming the silicon dioxide film, the silicon dioxide film may be formed on the gallium nitride semiconductor layer at a film formation rate equal to or lower than 5 nm/min.

In the forming the silicon dioxide film, the gallium nitride semiconductor layer may be heated at a temperature equal to or higher than 300° C. and equal to or lower than 400° C.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
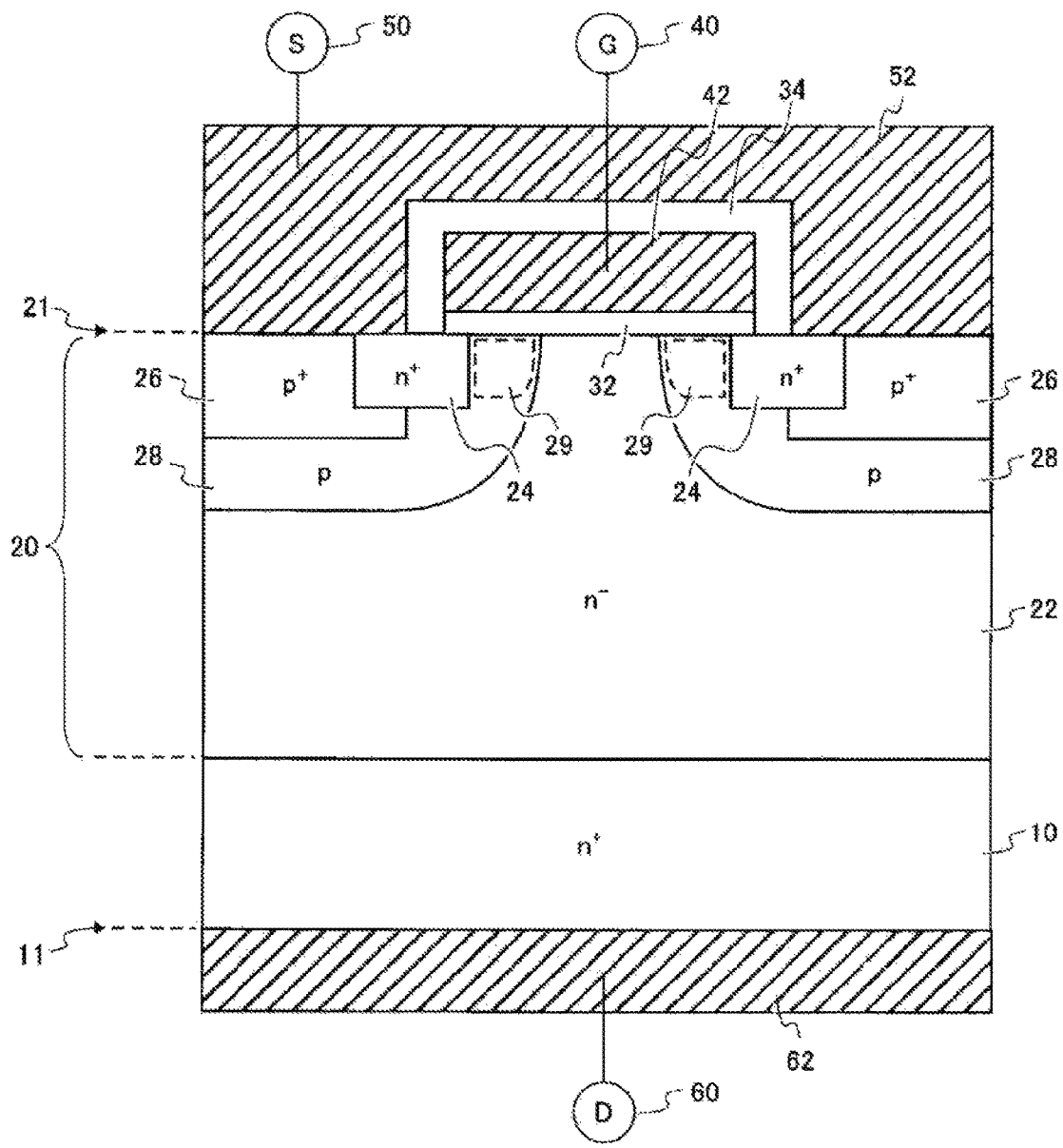
FIG. 1 is a figure showing a cross-section of a unit structure in a vertical MOSFET 100 of a first embodiment.

FIG. 1 is a figure showing a cross-section of a unit structure in a vertical MOSFET 100 of a first embodiment.

A semiconductor device of the present example is a planar-gate vertical MOSFET 100 using gallium nitride. In the following explanation, gallium nitride is abbreviated to GaN. The vertical MOSFET 100 of the present example includes a GaN n$^+$-type substrate 10, an epitaxial layer 20 as a GaN semiconductor layer, a gate insulating film 32 and an interlayer dielectric film 34, a gate electrode 42, a source electrode 52 and a drain electrode 62.

In the present example, n or p means that electrons or holes are the majority carrier, respectively. Also, the superscript + to the upper right of n or p means a higher carrier concentration than that indicated by n or p without the superscript +, and the superscript − to the upper right of n or p means a lower carrier concentration than that indicated by n or p without the superscript −. Also, in the present example, E means the base, which is 10 herein, and for example 1E+16 means $1 \times 10^{16}$.

The n$^+$-type substrate 10 of the present example is a GaN free-standing substrate. The GaN free-standing substrate may mean not a substrate having a GaN layer supported on a sapphire substrate or the like, but may mean a substrate formed using only GaN. Note that the GaN free-standing substrate may contain, as impurities, elements different from GaN.

The n$^+$-type substrate 10 of the present example contains one or more types among silicon (Si) and germanium (Ge) which are n-type impurities to GaN. p-type impurities to GaN are for example magnesium (Mg), calcium (Ca), beryllium (Be) and zinc (Zn). In the present example, magnesium (Mg) is used as p-type impurities.

The epitaxial layer 20 is a GaN layer epitaxially formed on the n$^+$-type substrate 10. In the present example, the direction from the n$^+$-type substrate 10 to the epitaxial layer 20 corresponds to the term "up" or "above", and the opposite direction corresponds to the term "under" or "below". Also, in the present example, a portion positioned "on" or "above" some other portion in a region or component may be referred to as a "top portion", in some cases. Also, a portion positioned "under" or "below" some other portion in a region or component may be referred to as a "bottom portion", in some cases. For example, a top portion of an n$^-$-type drift region 22 is in the n$^-$-type drift region 22 and near the interface between the n$^-$-type drift region 22 and the gate insulating film 32. Also, a bottom portion of the n$^-$-type drift region 22 is located in the n$^-$-type drift region 22 and near the interface between the n$^+$-type substrate 10 and the n$^-$-type drift region 22.

In the present example, for convenience of explanation, the n$^+$-type substrate 10 and the epitaxial layer 20 are described as separate components. However, in another example, a configuration obtained by combining the n$^+$-type substrate 10 and the epitaxial layer 20 may be referred to as a GaN substrate. In the other example, a top portion of the GaN substrate corresponds to a portion near a front surface 21 of the present example. Also, a bottom portion of the GaN substrate corresponds to a portion near a back surface 11 of the present example.

The epitaxial layer 20 of the present example has, on the front surface 21 side, the n$^-$-type drift region 22, an n$^+$-type source region 24, a p$^+$-type contact region 26 and a p-type well region 28. The n$^-$-type drift region 22 is an n$^-$-type region. The p-type well region 28 may at least partially be exposed to the front surface 21 of the epitaxial layer 20. In the present example, the gate insulating film 32 is provided on the p-type well region 28 exposed to the front surface 21. A portion near the p-type well region 28 exposed to the front surface 21 may function as a channel formation region 29.

The p$^+$-type contact region 26 is provided at a position shallower than the p-type well region 28. In the present example, "being shallower than the p-type well region 28" means that a bottom portion of the p$^+$-type contact region 26 is positioned above a bottom portion of the p-type well region 28. The p$^+$-type contact region 26 may have a function of lowering the contact resistance between the epitaxial layer 20 and source electrode 52. An alloy of GaN and the metal of the source electrode 52 may be formed around the interface between the p$^+$-type contact region 26 and the source electrode 52.

The n$^+$-type source region 24 is provided at a position shallower than the p$^+$-type contact region 26 and the p-type well region 28. In the present example, "being shallower than the p$^+$-type contact region 26 and the p-type well region 28" means that a bottom portion of the n$^+$-type source region 24 is positioned above bottom portions of the p$^+$-type contact region 26 and the p-type well region 28. Also, in the present example, a side portion of the n$^+$-type source region 24 contacts the p$^+$-type contact region 26 and the p-type well region 28. The n$^+$-type source region 24 may provide a path for electrons to reach the source electrode 52 from the channel formation region 29 at the time of channel formation.

The gate insulating film 32 of the present example is a silicon dioxide film. The gate insulating film 32 of the present example has a bottom portion provided entirely in direct contact with the front surface 21 of the epitaxial layer 20. The gate insulating film 32 of the present example is provided between the gate electrode 42 and the p-type well region 28. The gate insulating film 32 of the present example is a silicon dioxide film ($SiO_2$) formed by causing a TEOS gas to react with oxygen. The silicon dioxide film of the present example has impurity atoms. Specifically, the silicon dioxide film of the present example contains carbon at concentration lower than 2E+18 [cm$^{-3}$].

Carbon is bonded with oxygen to function as negative fixed charges in a silicon dioxide film, in some cases. The fixed charges in the gate insulating film 32 causes fluctuation of the gate threshold voltage ($V_{th}$) from a design value. Therefore, the fixed charges in the gate insulating film 32 are desirably suppressed as much as possible. In the present example, the concentration of carbon in the silicon dioxide film is set to be lower than 2E+18 [cm$^{-3}$], and further desirably equal to or lower than 1E+18 [cm$^{-3}$]. Thereby, deviation of the gate threshold voltage ($V_{th}$) from the design value can be suppressed. Also, variation in the gate threshold voltages ($V_{th}$) among the different channel formation regions 29 can be prevented.

The gate electrode 42 is provided on and in direct contact with the gate insulating film 32. The gate electrode 42 of the present example extends in the far side or near side direction in the figure, and electrically connects to a gate terminal 40. A gate signal which is an ON-signal to generate a channel in the channel formation region 29 or an OFF-signal to extinguish the channel may be input to the gate terminal 40.

The interlayer dielectric film 34 is provided on the gate electrode 42 and the epitaxial layer 20. The interlayer dielectric film 34 may electrically insulate the gate electrode 42 from the source electrode 52. The interlayer dielectric film 34 of the present example covers a top portion of the gate electrode 42, and side portions of the gate electrode 42 and the gate insulating film 32. A bottom portion of the interlayer dielectric film 34 of the present example is in direct contact with the front surface 21 of the epitaxial layer 20.

The interlayer dielectric film 34 may be any of a silicon oxide film, a silicon nitride film and a resin film. The interlayer dielectric film 34 of the present example is a silicon dioxide film formed with the same technique as that for the gate insulating film 32.

The source electrode 52 is provided on the front surface 21 and the interlayer dielectric film 34. An bottom portion of the source electrode 52 of the present example is in direct contact with the $n^+$-type source region 24 and the $p^+$-type contact region 26. The source electrode 52 of the present example electrically connects to a source terminal 50. The source terminal 50 may be at ground potential. The drain electrode 62 is provided under and in direct contact with the back surface 11 of the $n^+$-type substrate 10. The drain electrode 62 of the present example electrically connects to a drain terminal 60. Voltage corresponding to flowing current of the vertical MOSFET 100 may be applied to the drain terminal 60.

Figure 2:
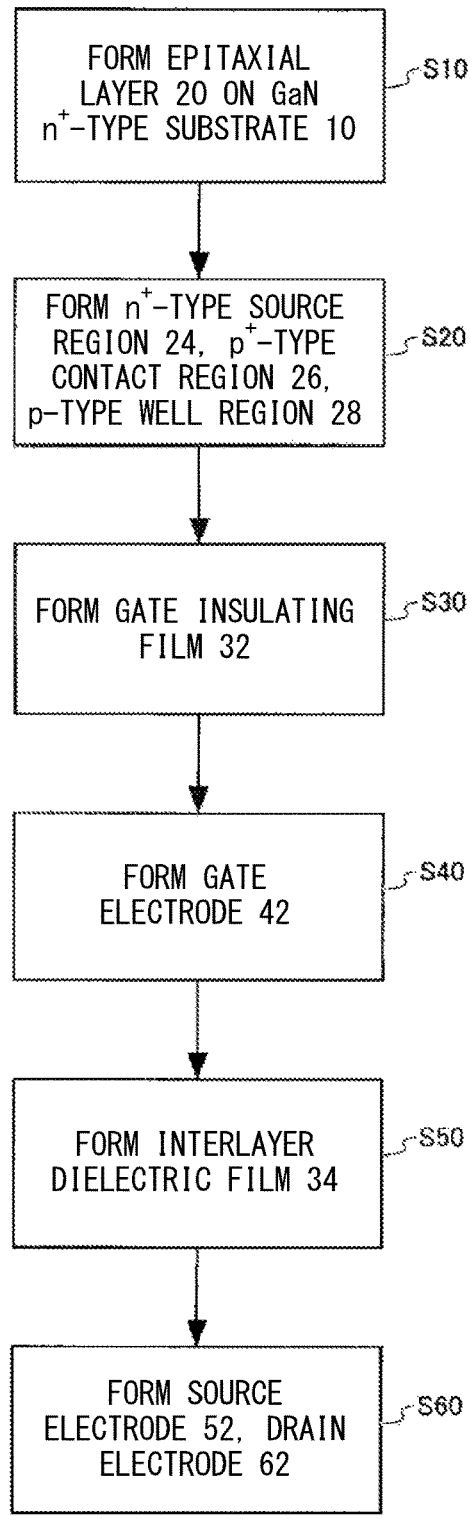
FIG. 2 is a figure showing a flow 200 of manufacturing the vertical MOSFET 100 of the first embodiment.

FIG. 2 is a figure showing a flow 200 of manufacturing the vertical MOSFET 100 of the first embodiment. In the manufacturing method of the present example, Step S10 to Step S60 are performed in this order.

Step S10 is a step of forming the epitaxial layer 20 on the $n^+$-type substrate 10. The n-type impurity concentration of the $n^+$-type substrate 10 may be equal to or higher than 1E+19 [$cm^{-3}$] and equal to or lower than 1E+20 [$cm^{-3}$]. The n-type impurity concentration of the epitaxial layer 20 may be approximately 1E+16 [$cm^{-3}$]. The epitaxial layer 20 may be formed by MOCVD (Metal Organic Chemical Vapor Deposition). For example, the epitaxial layer 20 is formed by MOCVD using trimethylgallium (TMG), ammonia ($NH_3$) and an appropriate carrier gas. If the vertical MOSFET 100 has the withstanding voltage of 1200 V, the thickness of the $n^+$-type substrate 10 may be set to 100 [μm] to 300 [μm], and the thickness of the epitaxial layer 20 may be set to 10 [μm].

Step S20 is a step of forming the $n^+$-type source region 24, the $p^+$-type contact region 26 and the p-type well region 28. At Step S20, p-type and n-type impurities are doped to the epitaxial layer 20, and thereafter the epitaxial layer 20 is annealed. Thereby, the $n^+$-type source region 24, the $p^+$-type contact region 26 and the p-type well region 28 are formed.

In the present example, in order to form the p-type well region 28, Mg ions accelerated at 180 [keV] are implanted at concentration of 2E+14 [$cm^{-2}$]. Also, in order to form the $p^+$-type contact region 26, Mg ions accelerated at 45 [keV] are implanted at concentration of 2E+15 [$cm^{-2}$]. Furthermore, in order to form the $n^+$-type source region 24, Si ions accelerated at 45 [keV] are implanted at concentration of 5E+15 [$cm^{-2}$]. In the ion implantation, a photoresist mask having a predetermined opening pattern may be used.

After the ion implantation, a cap layer is provided to the front surface 21. The cap layer may be silicon dioxide. Thereafter, the epitaxial layer 20 is annealed. Thereby, the $n^+$-type source region 24 having the n-type impurity concentration of 1E+20 [$cm^{-3}$], the $p^+$-type contact region 26 having the p-type impurity concentration of 4E+19 [$cm^{-3}$], and the p-type well region 28 having the p-type impurity concentration of 1E+17 [$cm^{-3}$] may be formed. After the annealing, the cap layer may be removed.

Step S30 is a step of forming the gate insulating film 32. As mentioned above, the gate insulating film 32 of the present example is a silicon dioxide film. The silicon dioxide film is formed into the shape of the gate insulating film 32 by patterning after film formation.

In the present example, the step of forming the silicon dioxide film includes a step of supplying a TEOS gas as a silicon raw material. The epitaxial layer 20 of the present example consists of a GaN material. Therefore, the gate insulating film 32 (silicon dioxide film) cannot be formed on the epitaxial layer 20 by thermal oxidization of the epitaxial layer 20.

In the present example, the step of forming the silicon dioxide film further includes a step of supplying an oxygen gas as an oxygen raw material, and forming the silicon dioxide film by plasma CVD (Chemical Vapor Deposition). In other words, in the present example, the silicon dioxide film is formed by plasma CVD using a TEOS gas as a silicon raw material and an oxygen ($O_2$) gas as an oxygen raw material.

Note that in the silicon dioxide film formation of the present example, gallium of the epitaxial layer 20 is taken into the silicon dioxide film. In the silicon dioxide film, gallium functions as positive charges. In the present example, by devising the film formation rate as mentioned below, the concentration of gallium in the silicon dioxide film can be lowered. Thereby, deviation of the gate threshold voltage ($V_{at}$) from the design value can be suppressed. Formation of the silicon dioxide film of the present example is mentioned in detail with reference to FIG. 3 to FIG. 5.

Step S40 is a step of forming the gate electrode 42. The gate electrode 42 may be polysilicon. After film-forming polysilicon on the gate insulating film 32, it may be formed into the shape of the gate electrode 42 by patterning.

Step S50 is a step of forming the interlayer dielectric film 34. The interlayer dielectric film 34 of the present example is a silicon dioxide film formed by plasma CVD which is the same as that for the gate insulating film 32. After film-forming the interlayer dielectric film 34 on the gate electrode 42, the interlayer dielectric film 34 may undergo patterning such that it is left at a top portion of the gate electrode 42 and side portions of the gate electrode 42 and the gate insulating film 32.

Step S60 is a step of forming the source electrode 52 and the drain electrode 62. The source electrode 52 and the drain electrode 62 of the present example may be laminates formed of a Ti (titanium) layer and an Al (aluminum) layer. In the source electrode 52, the Ti layer may be provided in direct contact with the front surface 21, and the Al layer may be provided on the Ti layer. Also, in the drain electrode 62, the Ti layer may be provided in direct contact with the back surface 11, and the Al layer may be provided under the Ti layer. Thereby, the vertical MOSFET 100 is complete.

Figure 3:
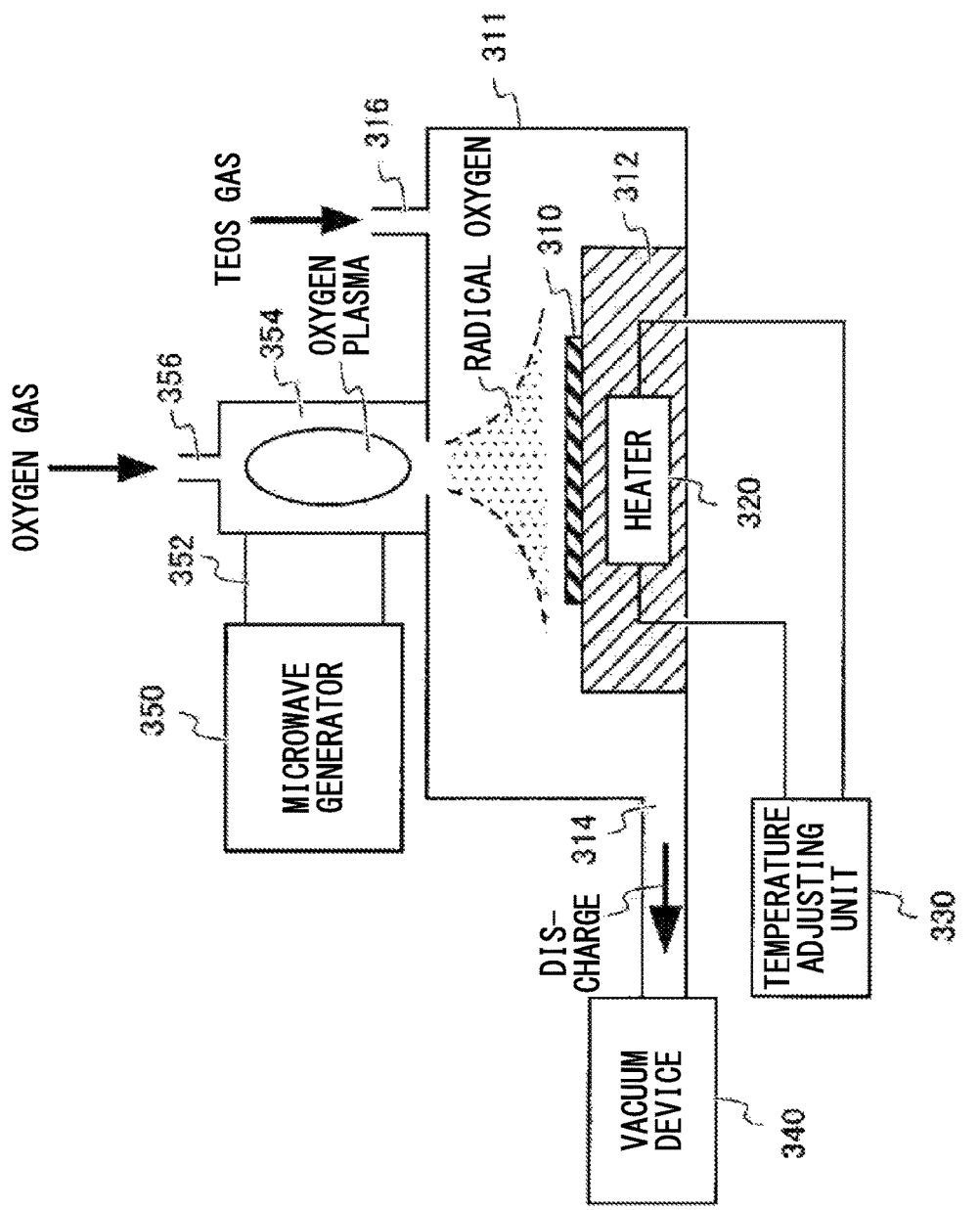
FIG. 3 is a figure showing an outline of a manufacturing device 300 to form a silicon dioxide film.

FIG. 3 is a figure showing an outline of a manufacturing device 300 to form a silicon dioxide film. The manufacturing device 300 of the present example has a reaction chamber 311, a temperature adjusting unit 330, a vacuum device 340, a microwave generator 350, a waveguide 352 and a plasma generation chamber 354.

The reaction chamber 311 has therein a pedestal 312 consisting of Al. A work 310 may be fixed on the pedestal 312 utilizing electrostatic attraction. The work 310 includes the $n^+$-type substrate 10 and the epitaxial layer 20. A heater 320 is provided inside the pedestal 312.

The temperature adjusting unit 330 can control the temperature of the heater 320 within the range of 100 [° C.] to 450 [° C.]. Because the pedestal 312 excels much in thermal conductivity, the temperature of the heater 320 can be regarded as the temperature of the work 310. The temperature adjusting unit 330 of the present example heats the work 310 at temperature equal to or higher than 300 [° C.] and equal to or lower than 400 [° C.] in the step of forming the silicon dioxide films as the gate insulating film 32 and the interlayer dielectric film 34. The vacuum device 340 suctions gas in the reaction chamber 311 through an outlet 314. The vacuum device 340 may control the atmospheric pressure in the reaction chamber 311 to be 200 [Pa] to 300 [Pa].

The microwave generator 350 connects to the plasma generation chamber 354 through the waveguide 352. The microwave generator 350 converts the state of oxygen ($O_2$) introduced from an inlet 356 into the plasma generation chamber 354 into the plasma state. Oxygen now in its plasma state advances into the reaction chamber 311. Oxygen in its plasma state is indicated as radical oxygen in the reaction chamber 311.

A TEOS gas is introduced from the inlet 316 into the reaction chamber 311. In the reaction chamber 311, TEOS reacts with the radical oxygen. Thereby, a silicon dioxide film is deposited on the front surface 21 of the epitaxial layer 20.

Figure 4:
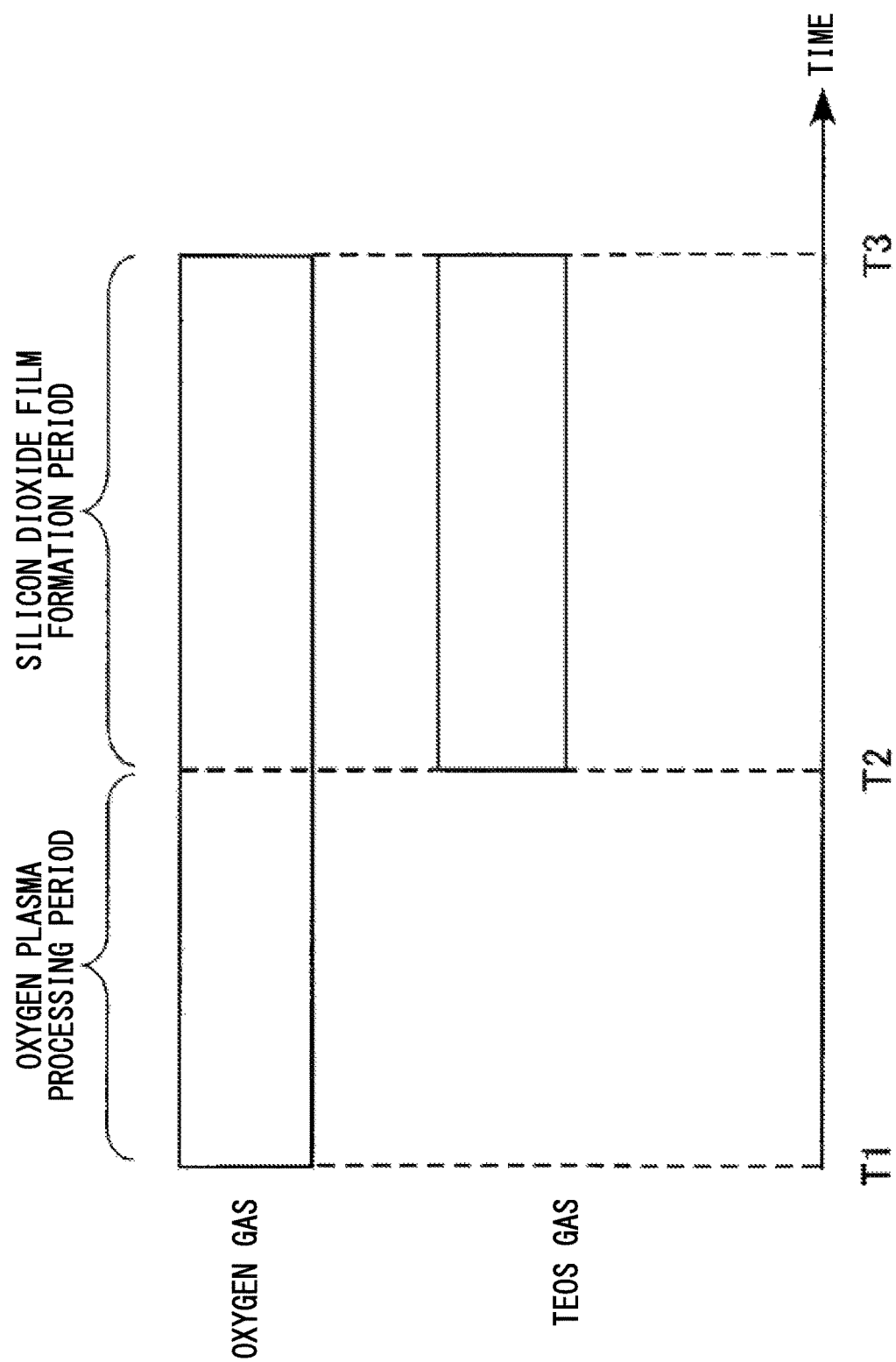
FIG. 4 is a figure for explaining an oxygen plasma processing period and a silicon dioxide film formation period in the manufacturing device 300.

FIG. 4 is a figure for explaining an oxygen plasma processing period and a silicon dioxide film formation period in the manufacturing device 300. The horizontal axis indicates time, and the vertical axis indicates the types of gas. In the present example, oxygen gas is supplied to the reaction chamber 311 at a flow rate of 90 [sccm] continuously from a time T1 to a time T3. In the present example, the period from the time T1 to the time T2 is an oxygen plasma processing period. Also, from the time T2 to the time T3, the TEOS gas is supplied to the reaction chamber 311 at a flow rate of 0.25 [sccm] to 2 [sccm]. In the present example, the period from the time T2 to the time T3 is a silicon dioxide film formation period.

Figure 5:
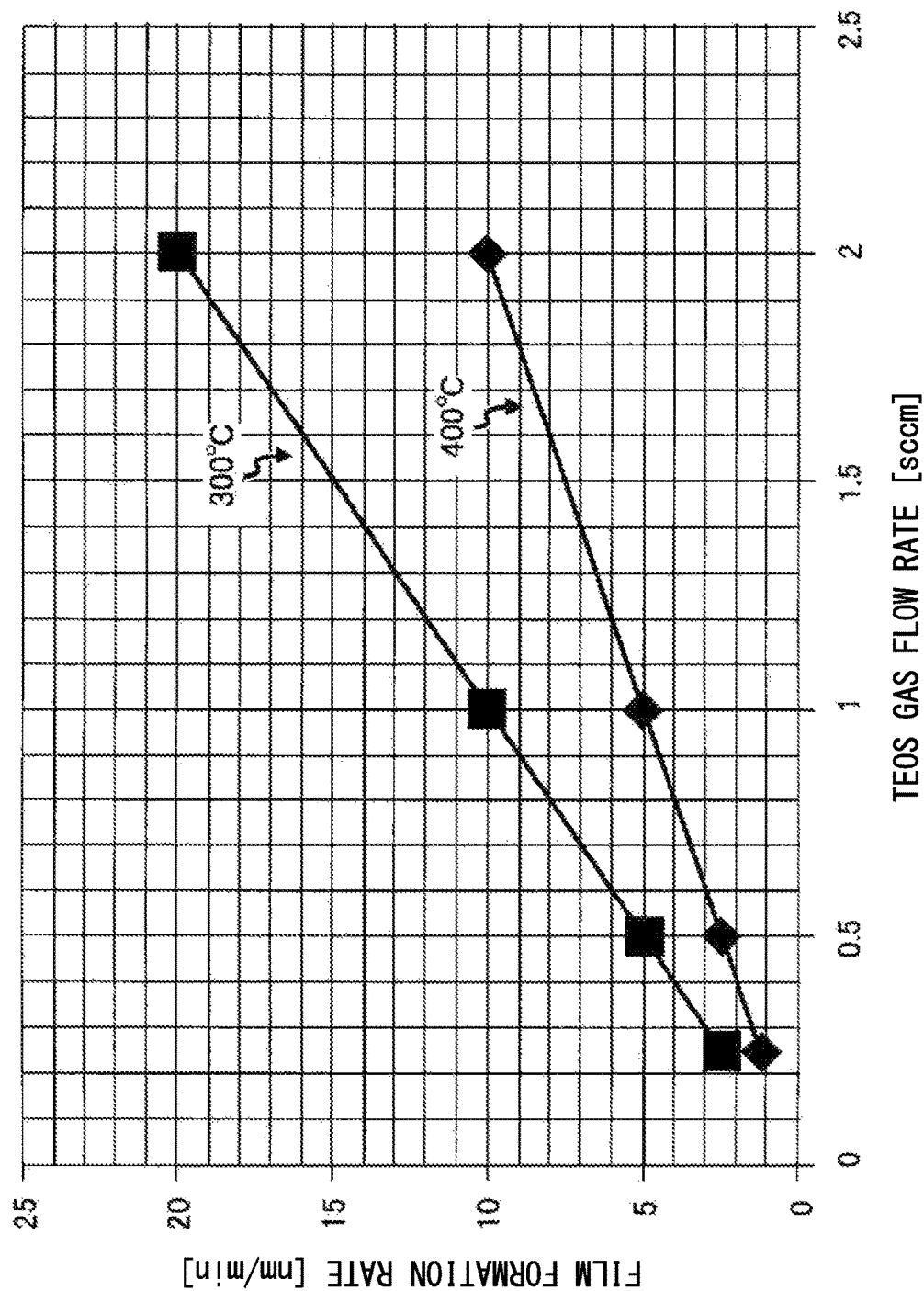
FIG. 5 is a figure showing silicon dioxide film formation rate [nm/min] (vertical axis) in relation to TEOS gas flow rate [sccm] (horizontal axis).

FIG. 5 is a figure showing silicon dioxide film formation rate [nm/min] (vertical axis) in relation to TEOS gas flow rate [sccm] (horizontal axis). The upper graph indicated with square plots is a result of heating the work 310 at 300 [° C.]. Also, the lower graph indicated with diamond-shaped plots is a result of heating the work 310 at 400 [° C.].

The TEOS gas flow rate and the rate per unit time of adsorption to the front surface 21 of the epitaxial layer 20 have a positive correlation. Therefore, the film formation rate increases as the TEOS gas flow rate increases. Also, the temperature of the work 310 and the rate per unit time of adsorption to the front surface 21 of the epitaxial layer 20 have a negative correlation. Therefore, the film formation rate decreases as the temperature of the work 310 increases. As is apparent from FIG. 5, the film formation rate in the case of 400 [° C.] is lower than the film formation rate in the case of 300 [° C.].

In a MOSFET using a Si substrate, a silicon dioxide film as an interlayer dielectric film is fabricated using a TEOS gas in plasma CVD, in some cases. The silicon dioxide film can be formed at a lower temperature as compared with a thermal oxide film. Also, the silicon dioxide film can be formed with less damage to a formed film formation surface and a structure positioned at the same level or lower than that. However, a silicon dioxide film formed using a TEOS gas in plasma CVD as mentioned above poses an issue of taking in fixed charges such as carbon. Therefore, a silicon dioxide film formed using a TEOS gas in plasma CVD has been used for an interlayer dielectric film but not for a gate insulating film.

Results of experiments conducted by the inventors of the present application has proven that the higher the silicon dioxide film formation rate is, the more prone carbon in the TEOS gas is to be taken into the silicon dioxide film. Therefore, in the present example, the TEOS gas flow rate and the temperature of the work 310 are controlled taking the film formation rate into consideration. Thereby, the carbon concentration in silicon dioxide was controlled.

Also, results of experiments conducted by the inventors of the present application has proven that the higher the silicon dioxide film formation rate is, the more prone gallium is to be taken into a silicon dioxide film. Mixing-in of gallium into a silicon dioxide film has been an issue unique to formation of the silicon dioxide film on a GaN layer. That is, mixing-in of gallium into a silicon dioxide film does not occur to a MOSFET with a Si substrate, a MOSFET with a SiC substrate or the like.

To cope with this, in the present example, at the step of forming a silicon dioxide film, a silicon dioxide film is formed on the epitaxial layer 20 at a film formation rate equal to or lower than 5 [nm/min]. Specifically, the film formation rate may be set to 5 [nm/min], 2.5 [nm/min] or 1 [nm/min]. The inventors of the present application found out that, as mentioned below, if the temperature of the work 310 is 300 [° C.], and the TEOS gas flow rate is set to equal to or lower than 0.5 [sccm], the fixed charges decreases to a permissible amount. Specifically, the flat band voltage Vfb, which is an index to assess an amount of electric charges in a film or the like, could be reduced to be equal to or lower than 1 [V].

According to the present experimental results, if the temperature of the work 310 is 400 [° C.], the TEOS gas flow rate may be set to be equal to or higher than 0.25 [sccm] and equal to or lower than 1 [sccm] in order to realize the film formation rate of 5 [nm/min]. Also, if the temperature of the work 310 is 300 [° C.], the TEOS gas flow rate may be set to be equal to or higher than 0.25 [sccm] and equal to or lower than 0.5 [sccm]. Taking the present experimental results into consideration, it can be said that if the temperature of the work 310 is equal to or higher than 300 [° C.] and equal to or lower than 400 [° C.], the maximum value for the TEOS gas flow rate may be set to be equal to or higher than 0.5 [sccm] and equal to or lower than 1 [sccm], and the minimum value for the TEOS gas flow rate may be set to 0.25 [sccm].

Figure 6A:
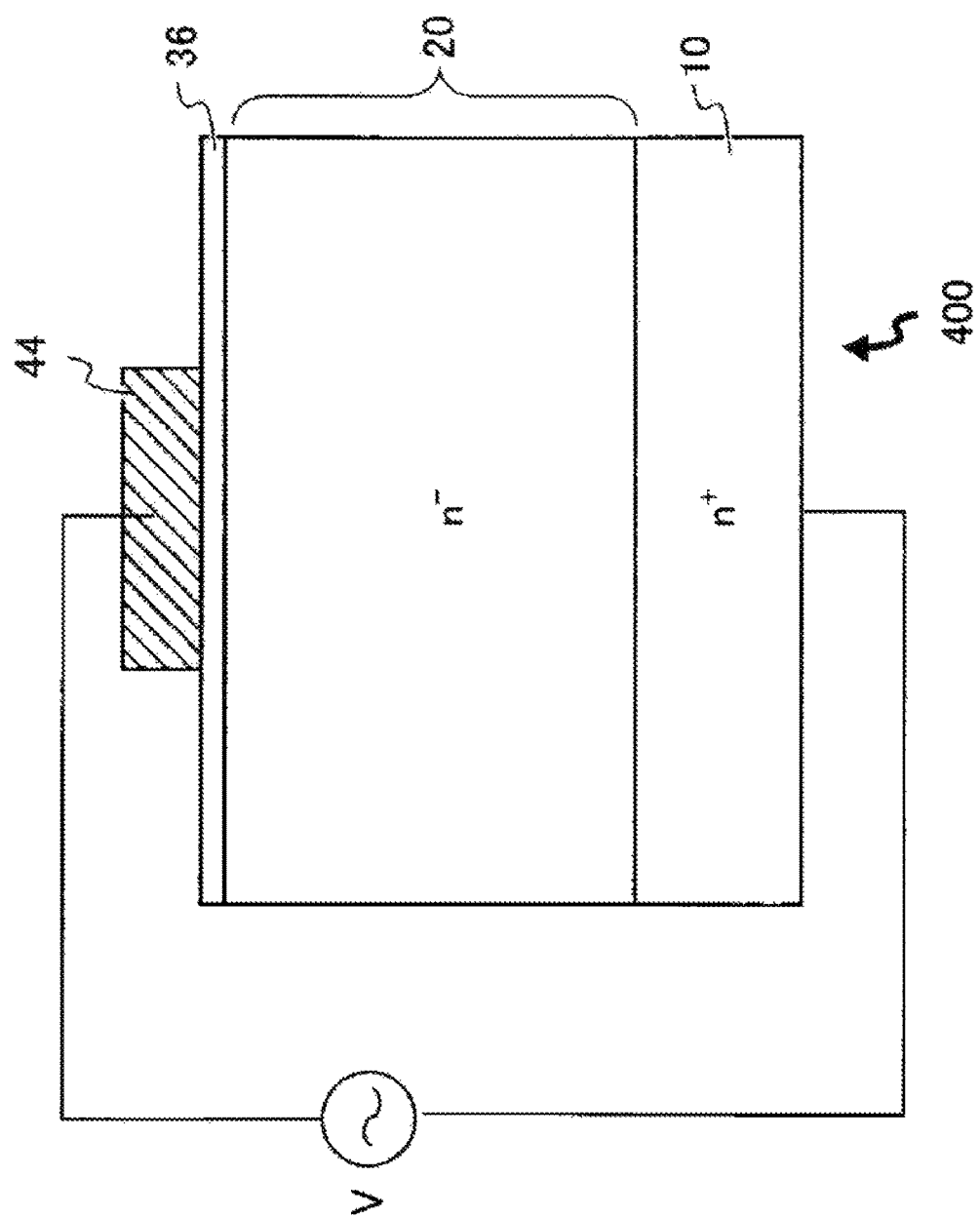
FIG. 6A is a figure showing an outline of an element 400, the flat band voltage of which was measured.

FIG. 6A is a figure showing an outline of an element 400, the flat band voltage of which was measured. In the present experiment, an $n^-$-type GaN epitaxial layer 20 was provided on a GaN $n^+$-type substrate 10. The epitaxial layer 20 is not provided with the $n^+$-type source region 24, the $p^+$-type contact region 26 and the p-type well region 28. Furthermore, the silicon dioxide film 36 was formed on the epitaxial layer 20 by the above-mentioned technique. The temperature of the work 310 at the time of formation of the silicon dioxide film 36 was set to 300 [° C.]. In addition, an Al metal layer 44 was provided on the silicon dioxide film 36.

Variable voltage was applied between the metal layer 44 and the $n^+$-type substrate 10, and the capacitance-voltage (C-V) characteristic of the element 400 as a MOS capacitor was assessed. Three types of the elements 400, which were formed at the TEOS gas flow rate of 2 [sccm], 1 [sccm] and 0.5 [sccm], respectively, were prepared. First, the C-V characteristic of the three types of the elements 400 was assessed. Next, the three types of the elements 400 were annealed at 400 [° C.]. The atmospheric gas used at the time of annealing was 10 [vol %] of hydrogen ($H_2$) and 90 [vol %] of nitrogen ($N_2$). Also, the ambient pressure was 1 atm. Then, the C-V characteristic of the three types of the elements 400 after the annealing was assessed.

As mentioned above, carbon in the silicon dioxide film 36 is considered to function as negative charges. In contrast to this, if carbon is bonded with hydrogen in the silicon dioxide film 36, carbon is considered to function as positive charges. Also, as mentioned above, gallium in the silicon dioxide film 36 is considered to functions as negative charges.

Figure 6B:
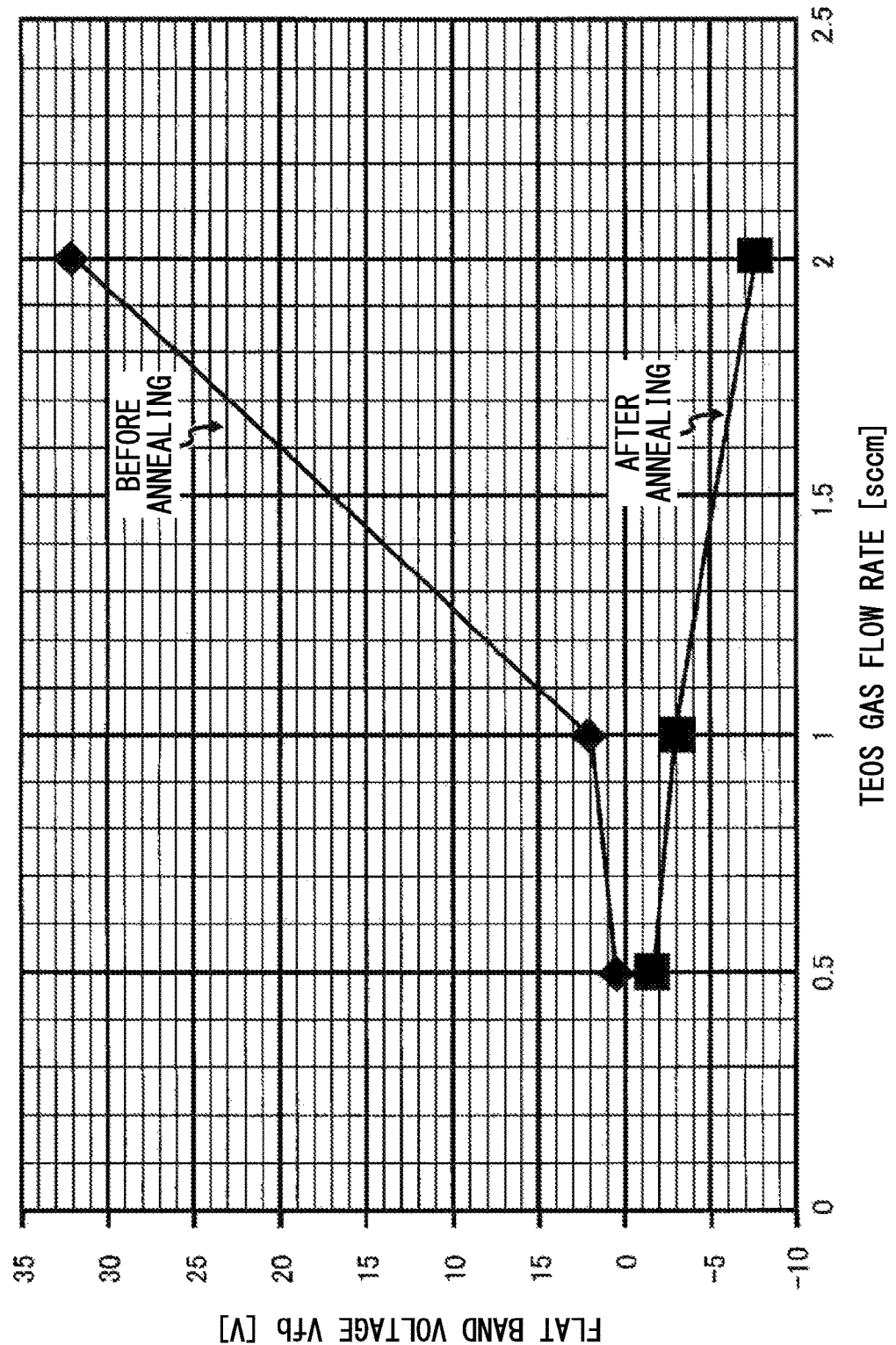
FIG. 6B is a figure showing flat band voltage $V_{fb}$ [V] (vertical axis) in relation to TEOS gas flow rate [sccm] (horizontal axis).

FIG. 6B is a figure showing flat band voltage $V_{fb}$ [V] (vertical axis) in relation to TEOS gas flow rate [sccm] (horizontal axis). As mentioned above, in the present experiment, the TEOS gas flow rate was set to 2 [sccm], 1 [sccm] and 0.5 [sccm], and $V_{fb}$ before annealing and after annealing was measured, respectively. The upper graph indicated with diamond-shaped plots corresponds to $V_{fb}$ before annealing. Also, the lower graph indicated with square plots corresponds to $V_{fb}$ after annealing.

Positive $V_{fb}$ means that more negative charges are included in the silicon dioxide film 36 than positive charges are. That is, when $V_{fb}$ is positive, majority fixed charges in the silicon dioxide film 36 are negative charges. Also, negative $V_{fb}$ means that more positive charges are included in the silicon dioxide film 36 than negative charges are. That is, if $V_{fb}$ is negative, majority fixed charges in the silicon dioxide film 36 are positive charges.

Fixed charges in the silicon dioxide film 36 decrease as the absolute value of $V_{fb}$ lowers. In the present example, if the TEOS gas flow rate is 0.5 [sccm], $V_{fb}$ became lowest as compared with the other flow rate examples. Specifically, under a condition of 0.5 [sccm] before annealing, $V_{fb}$ became 1 [V]. Also, under a condition of 0.5 [sccm] after annealing, $V_{fb}$ became −1.2 [V].

In manufacturing the vertical MOSFET 100, annealing in a hydrogen atmosphere is not performed. Therefore, the absolute value of $V_{fb}$ of the silicon dioxide film 36 as the gate insulating film 32 in the vertical MOSFET 100 may be regarded as 1 [V]. In addition, as is apparent from the experimental results, because the absolute value of $V_{fb}$ decreases as the TEOS gas flow rate decreases from 2 [sccm] to 0.5 [sccm], it can be said that the absolute value of $V_{fb}$ is equal to or lower than 1 [V] if the TEOS gas flow rate is equal to or lower than 0.5 [sccm]. Therefore, the silicon dioxide film 36 formed at the TEOS gas flow rate of 0.25 [sccm] can also be said to have $V_{fb}$ the absolute value of which is equal to or lower than 1 [V].

Figure 7:
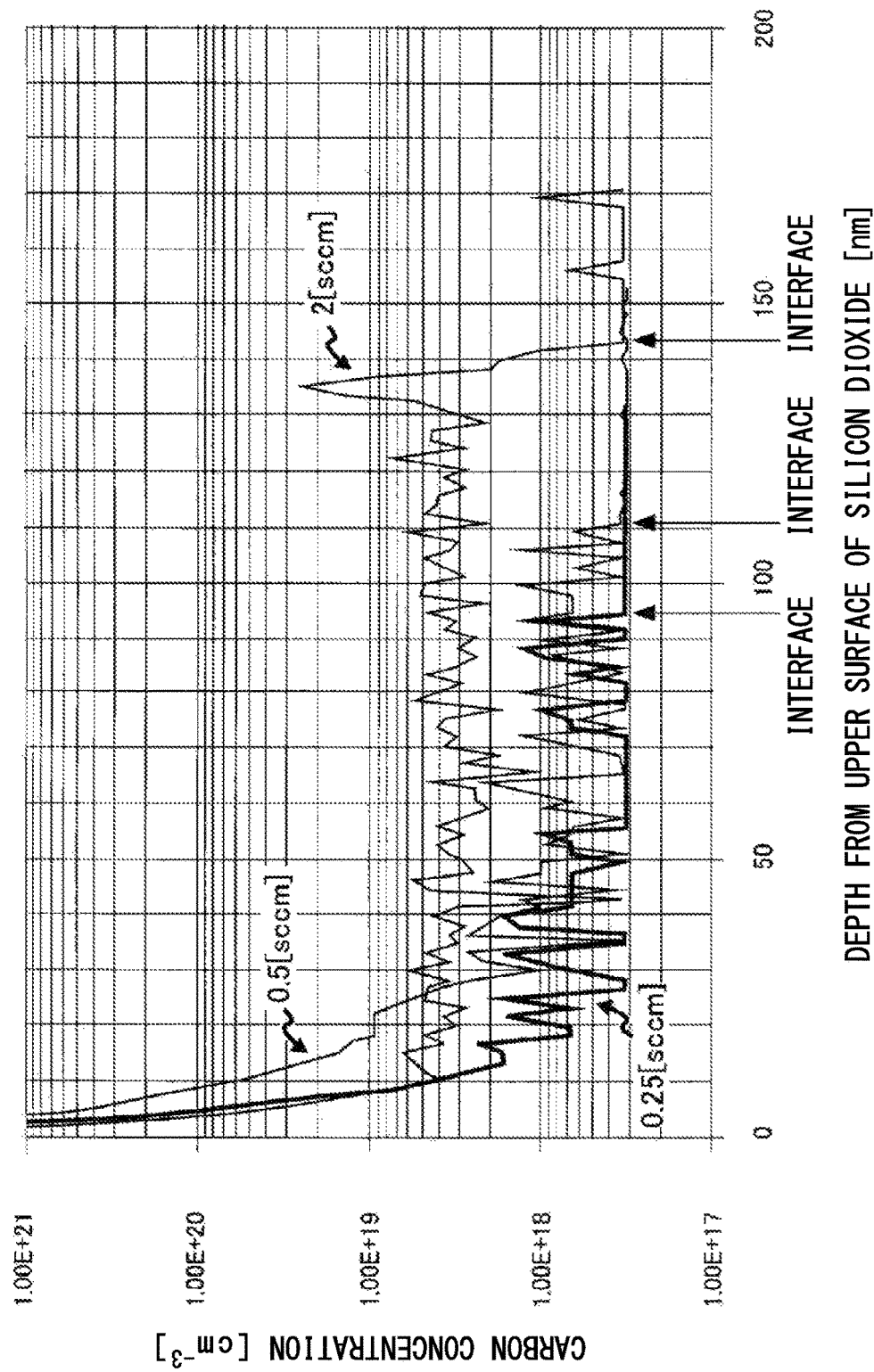
FIG. 7 is a figure showing carbon concentration [$cm^{-3}$] in a silicon dioxide film 36.

FIG. 7 is a figure showing carbon concentration [cm$^{-3}$] in the silicon dioxide film 36. The horizontal axis indicates the depth [nm] from the upper surface of the silicon dioxide film 36. The vertical axis indicates the carbon concentration [cm$^{-3}$]. The carbon concentration was assessed by SIMS (Secondary Ion Mass Spectrometry). The temperature of the work 310 at the time of silicon dioxide film 36 formation was set to 300 [° C.]. Similar to FIG. 6A, three types of the elements 400, which were formed at the TEOS gas flow rate of 2 [sccm], 0.5 [sccm] and 0.25 [sccm], respectively, were prepared. Data about 2 [sccm] and 0.5 [sccm] is indicated with a thin line, and data about 0.25 [sccm] is indicated with a bold line.

Along the horizontal axis in FIG. 7, the position of the interface between the silicon dioxide film 36 and the epitaxial layer 20 varies depending on the TEOS gas flow rate. The position of the interface in the case of 2 [sccm] is the position at the depth of 144 [nm]. The position of the interface in the case of 0.5 [sccm] is the position at the depth of 111 [nm]. Also, the position of the interface in the case of 0.25 [sccm] is the position at the depth of 94 [nm].

In the present experiment, the carbon detection threshold was 5E+17 [cm$^{-3}$]. Although in the present experiment, impurity concentrations equal to or lower than the detection threshold are detected, the impurity concentrations equal to or lower than the detection threshold are not reliable, correct concentrations. Also, in the region from 0 [nm] to 30 [nm] inclusive along the horizontal axis, normal data could not be obtained due to influence of surface contamination. Therefore, numerical values in the region are not taken into consideration.

As is apparent from the present experimental result, it can be said that the higher the TEOS gas flow rate is, the more prone carbon is to be taken into the silicon dioxide film 36. In the present experiment, in the case of 0.25 [sccm], carbon in the silicon dioxide film 36 became lower than 2E+18 [cm$^{-3}$]. In the experiment, noises and outliers are acquired, data including them is plotted. Therefore, the carbon concentration may be assessed based on numerical values from which influence of the noises and outliers are eliminated. For example, the arithmetical mean or logarithmic mean of the carbon concentration about a range from the interface in the silicon dioxide film 36 to the position which is a predetermined length above the interface may be regarded as the carbon concentration of the silicon dioxide film 36. For example, if assessment is performed based on the arithmetical mean about a range from the interface to the position which is 50 [nm] above the interface, the carbon concentration in the case of 0.25 [sccm] can be said to be equal to or lower than 1E+18 [cm$^{-3}$]. Also if the TEOS gas flow rate is 0.5 [sccm], the carbon concentration in the silicon dioxide film 36 can be assessed as being equal to or lower than 1E+18 [cm$^{-3}$], taking into consideration the fact noises and outliers are acquired.

If the TEOS gas flow rate is 0.25 [sccm], the position at the depth of 30 nm is positioned 64 nm above the interface which is at the depth of 94 nm (94 (interface) nm−30 nm=64 nm). In other words, at any position which is less than 64 nm above the interface facing the epitaxial layer 20, the carbon concentration of the silicon dioxide film 36 is lower than 2E+18 [cm$^{-3}$]. Also, because the thickness of the silicon dioxide film 36 of the present example is 94 nm, half of the thickness is 47 nm. Therefore, at any position which is less than half of the thickness of the silicon dioxide film 36 above the interface facing the epitaxial layer 20, the carbon concentration of the silicon dioxide film 36 is lower than 2E+18 [cm$^{-3}$].

The TEOS gas contains carbon unlike a silane gas. Therefore, the carbon concentration of the silicon dioxide film 36 formed using the TEOS gas is equal to or higher than a predetermined concentration. For example, the carbon concentration of the silicon dioxide film 36 formed using a TEOS gas can be said to be higher than 0 [cm$^{-3}$]. Therefore, in the silicon dioxide film 36 of the present example, at any position which is less than 64 nm (or less than half of the thickness of the silicon dioxide film 36) above the interface facing the epitaxial layer 20, the carbon concentration of the silicon dioxide film 36 may be: higher than 0 [cm$^{-3}$] and lower than 2E+18 [cm$^{-3}$]; equal to or higher than 1E+17 [cm$^{-3}$] and lower than 2E+18 [cm$^{-3}$]; equal to or higher than 3E+17 [cm$^{-3}$] and lower than 2E+18 [cm$^{-3}$]; and equal to or higher than 5E+17 [cm$^{-3}$] and lower than 2E+18 [cm$^{-3}$].

Figure 8:
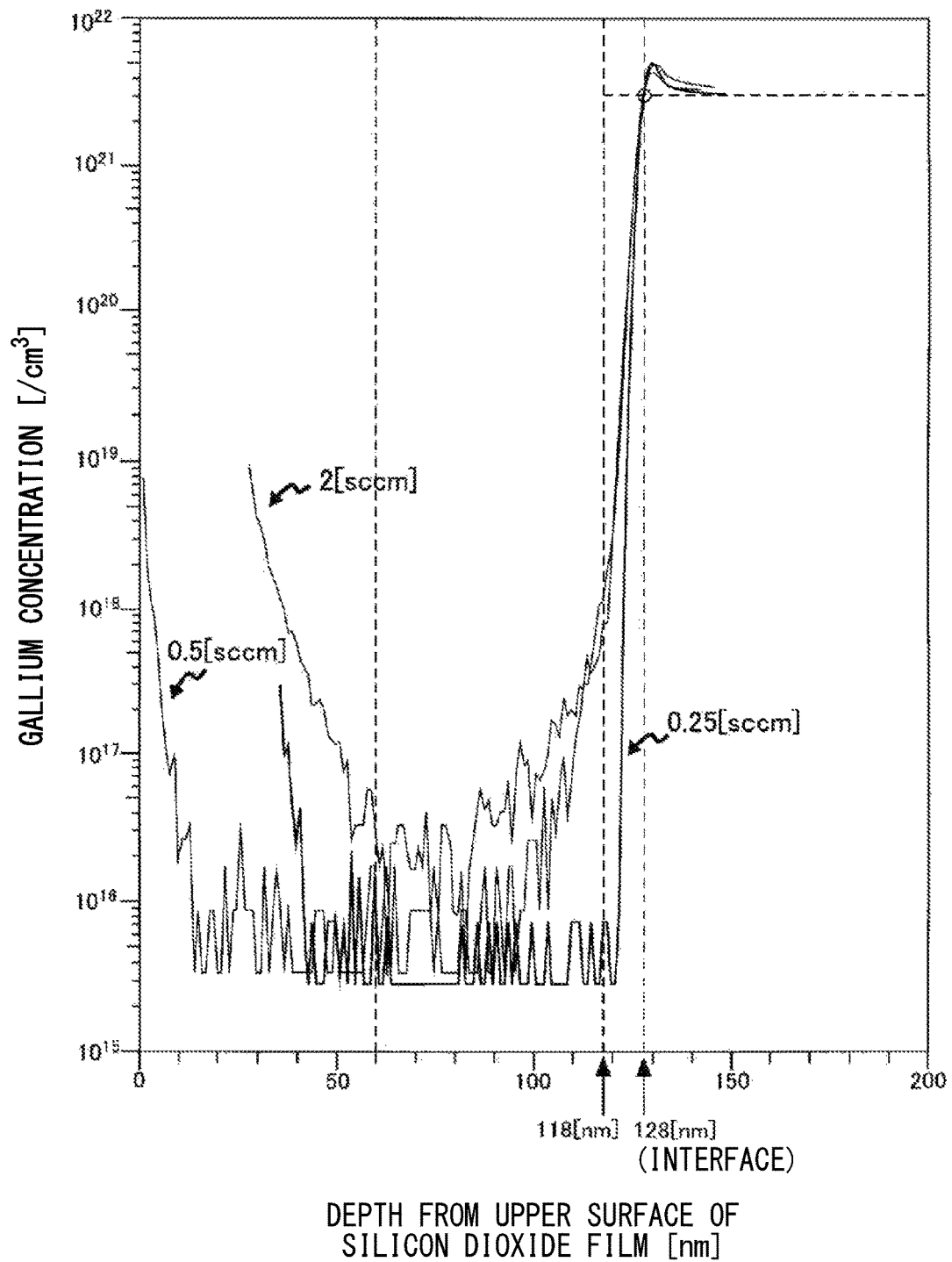
FIG. 8 is a figure showing gallium concentration [$cm^{-3}$] in the silicon dioxide film 36.

FIG. 8 is a figure showing gallium concentration [cm$^{-3}$] in the silicon dioxide film 36. The horizontal axis indicates the depth [nm] from the upper surface of the silicon dioxide film 36. The vertical axis indicates the gallium concentration [cm$^{-3}$]. The gallium concentration was assessed by SIMS (Secondary Ion Mass Spectrometry). The temperature of the work 310 at the time of silicon dioxide film 36 formation was set to 300 [° C.]. Similar to FIG. 6A, three types of the elements 400, which were formed at the TEOS gas flow rate of 2 [sccm], 0.5 [sccm] and 0.25 [sccm], respectively, were prepared. Data about 2 [sccm] and 0.5 [sccm] is indicated with a thin line, and data about 0.25 [sccm] is indicated with a bold line.

In the present experiment, the gallium detection threshold was 8E+15 [cm$^{-3}$]. In FIG. 8, the interface between the silicon dioxide film 36 and the epitaxial layer 20 is caused to match among respective pieces of data about 2 [sccm], 0.5 [sccm] and 0.25 [sccm]. Extrapolation of the graphs in the rightward direction along the horizontal axis shows that the gallium concentration gradually attenuates after peaks, and approaches a fixed value. In the present experiment, an intersection with a graph obtained by extrapolation of the fixed value of the gallium concentration in the leftward direction along the horizontal axis is the interface between the silicon dioxide film 36 and the epitaxial layer 20. The interface corresponds to the position of 128 [nm] along the horizontal axis. In the region from 0 [nm] to 60 [nm] inclusive along the horizontal axis, normal data could not be obtained due to influence of surface contamination. Therefore, numerical values in the region are not taken into consideration.

As is apparent from the present experimental result, the higher the TEOS gas flow rate is, the more prone gallium is to be taken into the silicon dioxide film 36. In the present experiment, in the case of 0.25 [sccm], the gallium concentration in the silicon dioxide film 36 became equal to or lower than 1E+17 [cm$^{-3}$] at positions which are 10 [nm] or more above the front surface 21 of the GaN epitaxial layer 20. Because the gallium concentration was too high near the interface between the silicon dioxide film 36 and the GaN epitaxial layer 20, the position at the depth of 118 [nm] which is 10 [nm] apart from the interface was selected in the present experiment example.

In other words, in the case of 0.25 [sccm], the gallium concentration in the range from the position at the depth of 118 [nm] to the position at the depth of 60 [nm] became equal to or lower than 1E+17 [cm$^{-3}$]. According to the present experimental result, it can also be said that in the case of 0.25 [sccm], the gallium concentration in the range is equal to or lower than 3E+16 [cm$^{-3}$]. Furthermore, taking noises and outliers into consideration, it can also be said that in the case of 0.25 [sccm], the gallium concentration in the range is equal to or lower than 2E+16 [cm$^{-3}$].

If the TEOS gas flow rate was 0.25 [sccm], the position at the depth of 60 nm is positioned 68 nm above the interface which is at the depth position of 128 nm (128 (interface) nm−60 nm=68 nm). In other words, at all the positions above the interface which is 10 nm or more and less than 68 nm above the interface facing the epitaxial layer 20, the gallium concentration of the silicon dioxide film 36 is equal to or lower than 1E+17 [cm$^{-3}$]. Also, because the thickness of the silicon dioxide film 36 of the present example is 128 nm, half of the thickness is 64 nm. Therefore, at any position which is 10 nm or more and less than half of the thickness of the silicon dioxide film 36 above the interface facing the epitaxial layer 20, the gallium concentration of the silicon dioxide film 36 is equal to or lower than 1E+17 [cm$^{-3}$].

In a range from the interface facing the epitaxial layer 20 to the position which is half of the thickness of the silicon dioxide film 36 apart from the interface (in other words, 64 nm above the interface), the above-mentioned range of carbon concentration is also satisfied. Therefore, at any position which is 10 nm or more and less than half of the thickness of the silicon dioxide film 36 above the interface facing the epitaxial layer 20, the concentration of impurity atoms contained in the silicon dioxide film 36 may satisfy carbon concentrations and gallium concentrations in the above-mentioned ranges.

Figure 9:
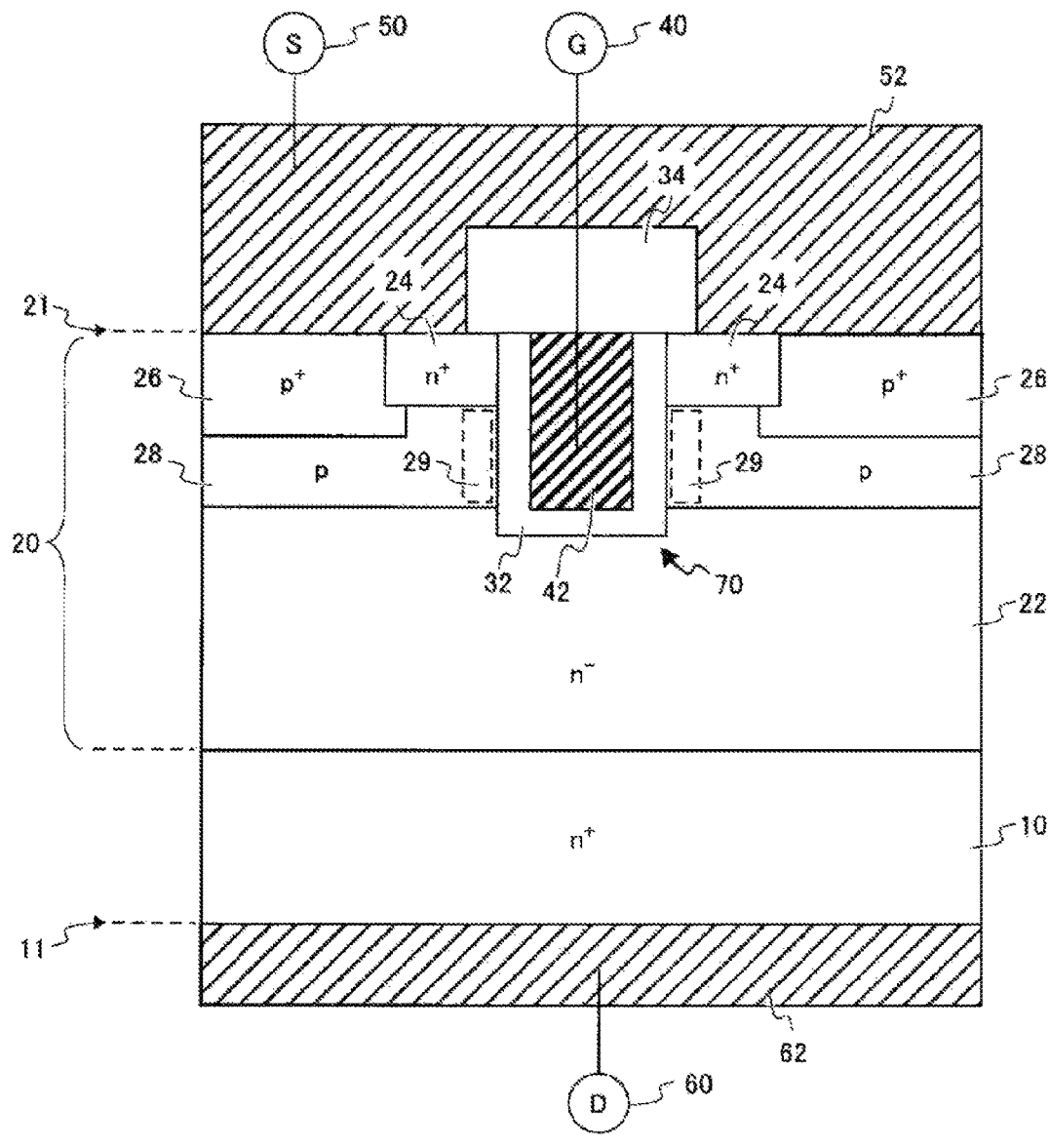
FIG. 9 is a figure showing a cross-section of a unit structure in a vertical MOSFET 500 of a second embodiment.

FIG. 9 is a figure showing a cross-section of a unit structure of a vertical MOSFET 500 of a second embodiment. The semiconductor device of the present example is the trench-gate vertical MOSFET 500 using GaN. In the present example, a trench portion 70 is provided in the epitaxial layer 20. The gate insulating film 32 which is a silicon dioxide film is provided in direct contact with a bottom portion and side portion of the trench portion 70. The gate electrode 42 is provided in contact with the gate insulating film 32 and inside the trench portion 70. The gate insulating film 32 at a side portion of the trench portion 70 is positioned between a side portion of the gate electrode 42 and the n$^+$-type source region 24 and the p-type well region 28. The channel formation region 29 is positioned at the p-type well region 28 at a side portion of the trench portion 70. The interlayer dielectric film 34 is provided on the trench portion 70. The interlayer dielectric film 34 of the present example is in direct contact with upper portions of the gate insulating film 32 and the gate electrode 42 and an upper portion of the n$^+$-type source region 24. This is a difference from the first embodiment. In other respects, it may be the same as the first embodiment. Silicon dioxide films as the gate insulating film 32 and the interlayer dielectric film 34 may be the silicon dioxide films of the first embodiment.

Figure 10:
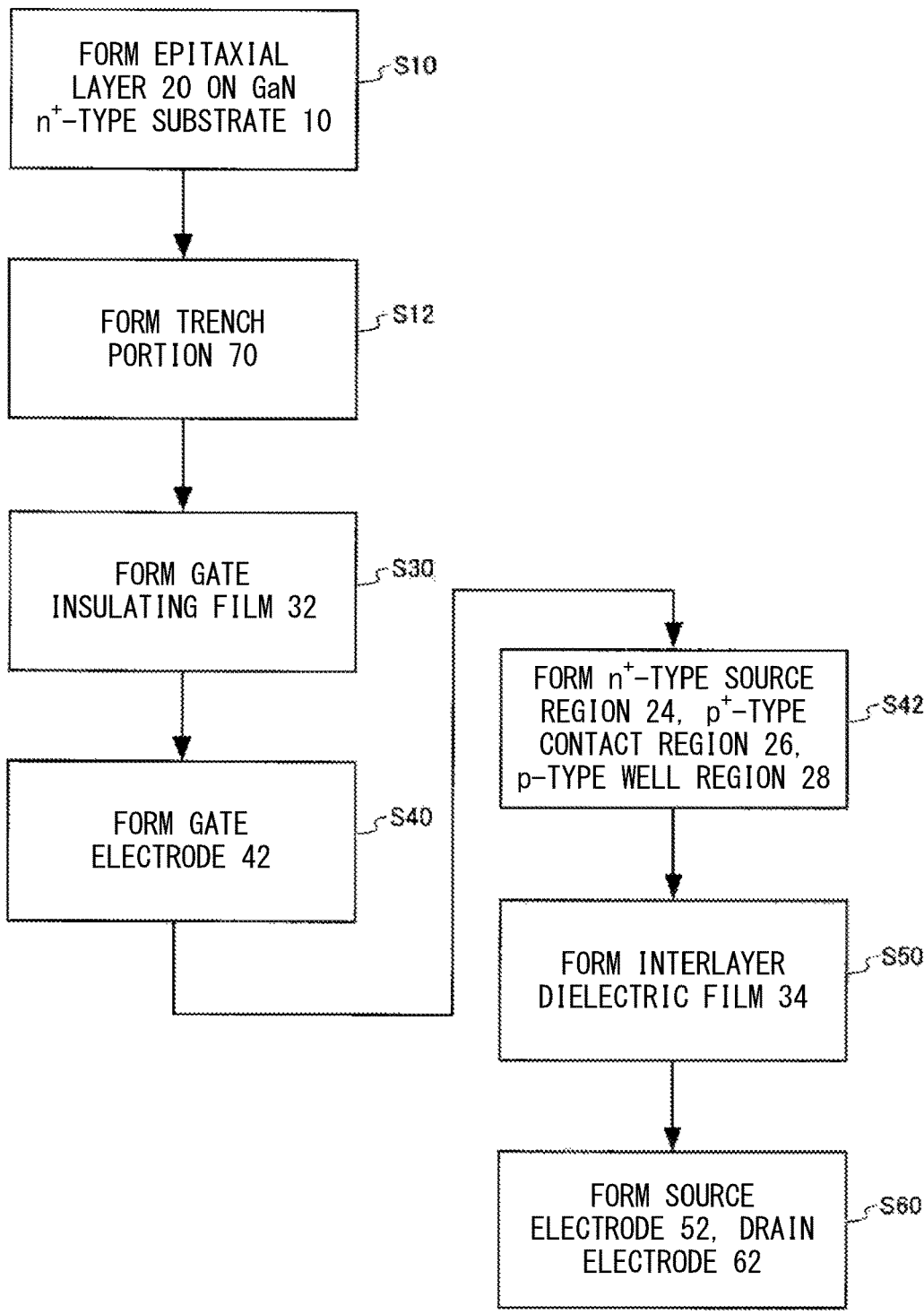
FIG. 10 is a figure showing a flow 600 of manufacturing the vertical MOSFET 500 of the second embodiment.

FIG. 10 is a figure showing a flow 600 of manufacturing the vertical MOSFET 500 of the second embodiment. The present example has Step S12 of forming the trench portion 70 between Step S10 and Step S30. Also, in the present example, Step S42 of forming the n$^+$-type source region 24, the p$^+$-type contact region 26 and the p-type well region 28 (corresponding to Step S20 in the manufacturing flow 200) is positioned between Step S40 of forming the gate electrode 42 and Step S50 of forming the interlayer dielectric film 34. This is a difference from the first embodiment. In other respects, it may be the same as the first embodiment. In the present example also, effects similar to those in the first embodiment can be attained.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE SYMBOLS

10: n$^+$-type substrate; 11: back surface; 20: epitaxial layer; 21: front surface; 22: n$^-$-type drift region; 24: n$^+$-type source region; 26: p$^+$-type contact region; 28: p-type well region; 29: channel formation region; 32: gate insulating film; 34: interlayer dielectric film; 36: silicon dioxide film; 40: gate terminal; 42: gate electrode; 44: metal layer; 50: source terminal; 52: source electrode; 60: drain terminal; 62: drain electrode; 70: trench portion; 100: vertical MOSFET; 200: manufacturing flow; 300: manufacturing device; 310: work; 311: reaction chamber; 312: pedestal; 314: outlet; 316: inlet;

320: heater; 330: temperature adjusting unit; 340: vacuum device; 350: microwave generator; 352: waveguide; 354: plasma generation chamber; 356: inlet; 400: element; 500: vertical MOSFET; 600: manufacturing flow

What is claimed is:

1. A semiconductor device using a gallium nitride semiconductor layer, the semiconductor device comprising:
 a silicon dioxide film that is provided at least partially in direct contact with the gallium nitride semiconductor layer and has impurity atoms, wherein
 at any position which is less than 64 nm above a front surface of the gallium nitride semiconductor layer, the silicon dioxide film contains as the impurity atoms:
 carbon at concentration higher than $5E+17$ cm$^{-3}$ and lower than $2E+18$ cm$^{-3}$; and gallium at concentration equal to or lower than $1E+17$ cm$^{-3}$,
 the silicon dioxide film is positioned between an aluminum metal layer provided in direct contact with the silicon dioxide film and the gallium nitride semiconductor layer, and
 an absolute value of a flat band voltage in a MOS structure consisting of the aluminum metal layer, the silicon dioxide film and the gallium nitride semiconductor layer is equal to or lower than 1 V.

2. The semiconductor device according to claim 1, further comprising:
 a gate electrode provided on and in direct contact with the silicon dioxide film, wherein
 the gate electrode is the aluminum metal layer,
 on a front surface side on which the silicon dioxide film is provided, the gallium nitride semiconductor layer has a p-type well region having p-type impurities to the gallium nitride semiconductor layer, and
 the silicon dioxide film is a gate insulating film provided between the gate electrode and the p-type well region.

3. The semiconductor device according to claim 1, wherein the silicon dioxide film is an interlayer dielectric film provided on the gallium nitride semiconductor layer.

* * * * *